United States Patent

Kennedy et al.

Patent Number: 5,751,148
Date of Patent: May 12, 1998

[54] METHOD FOR DETECTING ELECTRICAL CONNECTION BETWEEN ANTENNA AND RECEIVER FOR A MOTOR VEHICLE

[75] Inventors: John F. Kennedy, Dearborn; Andrew Adrian, Dexter, both of Mich.

[73] Assignee: Ford Motor Company, Dearborn, Mich.

[21] Appl. No.: 717,574

[22] Filed: Sep. 23, 1996

[51] Int. Cl.[6] .......................... H04B 17/00; G01R 31/02
[52] U.S. Cl. .................... 324/501; 455/67.3; 343/703; 324/538
[58] Field of Search .................................. 343/760, 703; 455/67.1, 67.3, 226.4; 324/501, 503, 520, 538

[56] References Cited

U.S. PATENT DOCUMENTS

| | | |
|---|---|---|
| 3,467,867 | 9/1969 | Armes et al. . |
| 3,860,872 | 1/1975 | Richardson .............................. 455/67.3 |
| 4,065,719 | 12/1977 | Penningroth et al. . |
| 4,095,172 | 6/1978 | Strand . |
| 4,506,385 | 3/1985 | Fedde ...................................... 455/67.3 |
| 5,208,543 | 5/1993 | Albiniak . |
| 5,444,892 | 8/1995 | Hibino .................................... 455/97.1 |
| 5,475,870 | 12/1995 | Weaver ................................... 455/67.1 |
| 5,487,176 | 1/1996 | Yoneyama ............................... 455/67.1 |

Primary Examiner—Gerard R. Strecker
Assistant Examiner—Jose M. Solis
Attorney, Agent, or Firm—Mark L. Mollon, Esq.; Roger L. May, Esq.

[57] ABSTRACT

A method for detecting an electrical connection between an antenna system and a receiver for a motor vehicle, the receiver having an automatic gain control with a variable impedance and a PIN diode connected therebetween, includes the steps of increasing the variable impedance of the automatic gain control, measuring signal strength of a signal received from the antenna system, decreasing the variable impedance of the automatic gain control, measuring the signal strength of the signal receiving from the antenna system, correlating the signal strength to the variable impedance to generate a correlation, and determining whether the antenna system is electrically connected to the receiver based on the correlation of the signal strength to the variable impedance.

8 Claims, 2 Drawing Sheets

METHOD FOR DETECTING ELECTRICAL CONNECTION BETWEEN ANTENNA AND RECEIVER FOR A MOTOR VEHICLE

BACKGROUND OF THE INVENTION

1. Field of the Invention

The present invention relates generally to a method for detecting the proper operation of a radio system for a motor vehicle. More specifically, the present invention relates to a method for detecting whether an antenna is connected to a receiver of a radio system of a motor vehicle.

2. Description of the Related Art

Many attempts have been made to ideally test a radio for a motor vehicle to determine whether an antenna has been electrically connected thereto. One such attempt is disclosed in U.S. Pat. No. 4,095,172, issued to Strand on Jun. 13, 1978. In this patent, a vehicle antenna tester is disclosed. The vehicle antenna tester tests the antenna to determine whether faulty grounding of a shielding conductor exists, whether there is a break in the continuity of the lead wire of the antenna and whether leakage paths between the antenna and the isolated conductor to a chassis ground or shielding conductor exists. This tester is a separate system independent from the radio system and/or the motor vehicle. The tester may be used prior to installation or after installation of the radio system in the motor vehicle. This tester does not have the capability of automatically testing the electrical connection between the antenna and the radio system of the motor vehicle. More specifically, this tester disclosed requires the operation thereof to be performed using human interaction. This tester is not an automatic system. Therefore, this tester requires additional assembly time and is accurate only to the extent that the operator using the tester correctly connects the vehicle antenna tester to the vehicle, antenna, and radio system. Thus, there is a need in the art to test the radio system automatically without adding additional time to the manufacturing process of the motor vehicle.

SUMMARY OF THE INVENTION

Accordingly, a method for detecting an electrical connection between an antenna system and a receiver for a motor vehicle is disclosed. The receiver includes an automatic gain control with a variable impedance and a PIN diode connected therebetween. The method includes the step of increasing the variable impedance of the automatic gain control. The method includes the step of measuring signal strength of a signal received from the antenna system. The method further includes the step of decreasing the variable impedance of the automatic gain control. The method includes the step of measuring the signal strength of the signal received from the antenna system after the variable impedance of the automatic gain control has been decreased. The method includes the step of correlating the signal strength to the variable impedance to generate a correlation. The method also includes the step of determining whether the antenna system is electrically connected to the receiver based on the correlation of the signal strength to the variable impedance.

One advantage associated with the present invention is the ability to test the electrical connection between the antenna and the receiver of the radio system for the motor vehicle. Another advantage associated with the present invention is the ability to automatically test the electrical connection between the antenna and the receiver. Yet another advantage associated with the present invention is the ability to automatically test the connection between the antenna and the receiver without adding additional time to manufacture the motor vehicle. Still another advantage associated with the present invention is the ability to test the electrical connection between the antenna and the receiver precisely and accurately.

Other features and advantages of the present invention will be readily appreciated as the same becomes better understood after reading the subsequent description taken in conjunction with the accompanying drawings.

DESCRIPTION OF THE PREFERRED EMBODIMENT(S)

Figure 1:
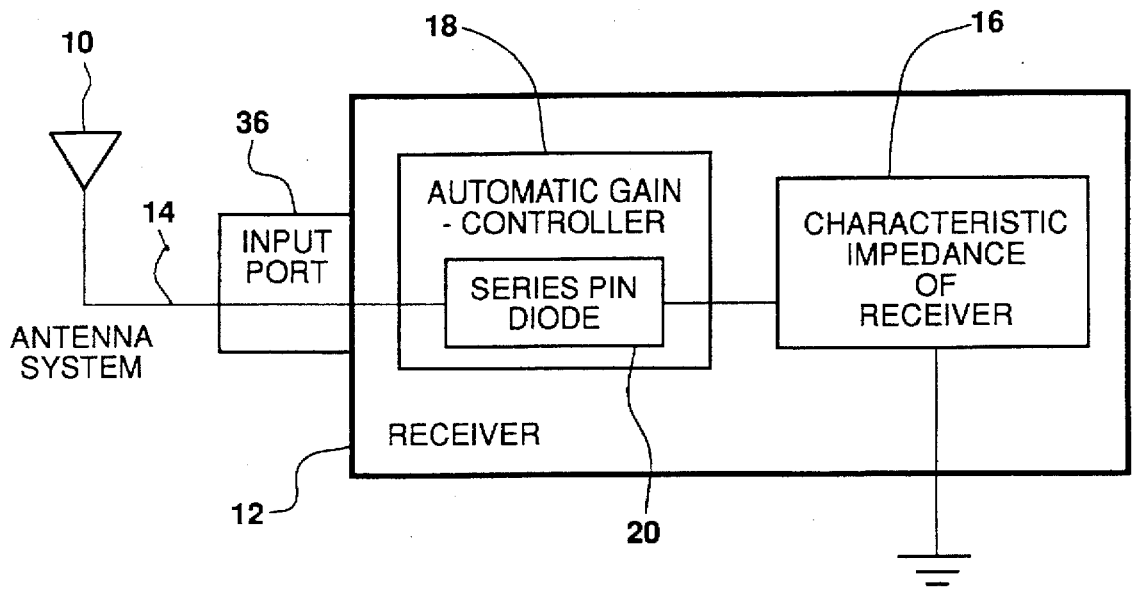
FIG. 1 is a block diagram of an antenna system and a receiver for a motor vehicle.

Referring to FIG. 1, an antenna system 10 is electrically connected to a receiver 12 through an electrical conductor 14. The antenna 10 is used to receive electromagnetic signals which are to be received and amplified by the receiver 12 whereafter those signals are transformed into audible signals to be heard by the operator and occupants of the motor vehicle (not shown). The receiver 12 has a characteristic impedance 16. The characteristic impedance 16 of the receiver 12 counts for all the impedance found therein. An automatic gain controller 18 is incorporated into the receiver 12. The automatic gain controller 18 has a separate variable impedance not accounted for in the characteristic impedance 16 of the receiver 12. The automatic gain controller 18 is designed to compensate for varying signals strengths received by the antenna system 10. More specifically, the automatic gain controller 18 raises the variable impedance of the receiver 12 when a signal received by the antenna system 10 is strong and minimizes the variable impedance of the receiver 12 when the signal received by the antenna system 10 is weak. This helps moderate the signal received by the antenna system 10 within a preferred range.

The automatic gain controller 18 includes a PIN diode 20 which is used to attenuate the signal received from the antenna system 10. The automatic gain controller 18 biases the PIN diode 20 to vary the attenuation thereof depending on the strength of the signal received by the antenna system 10. In one embodiment, the PIN diode 20 is biased between two conditions, either full on or full off.

Figure 2:
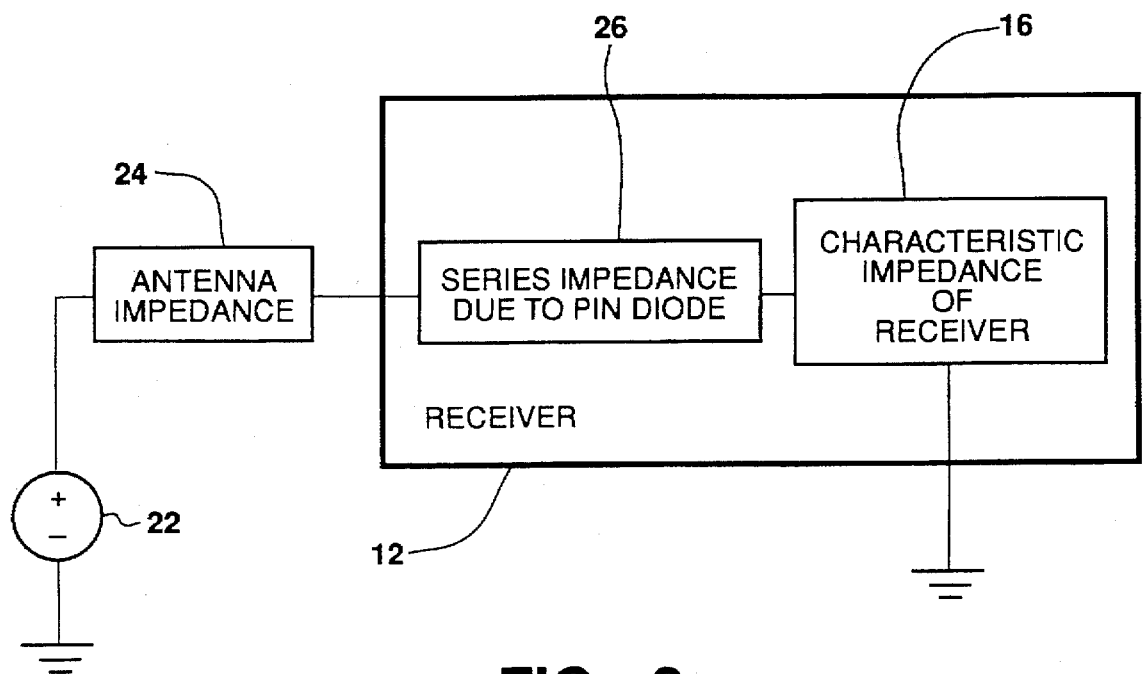
FIG. 2 is a block diagram of an electrical model for the antenna system and receiver of FIG. 1.

Referring to FIG. 2, an electrical model of the receiver 12 is shown in block diagram form. A power source 22 represents the signal received by the antenna system 10 of FIG. 1. Antenna impedance 24 represents the impedance introduced into the system of FIG. 1 by the antenna system 10. A series impedance 26 further attenuates the signal generated by the power source 22 due to the PIN diode 20. Finally, the characteristic impedance 16 of the receiver 12 is diagrammatically shown.

Figure 3:
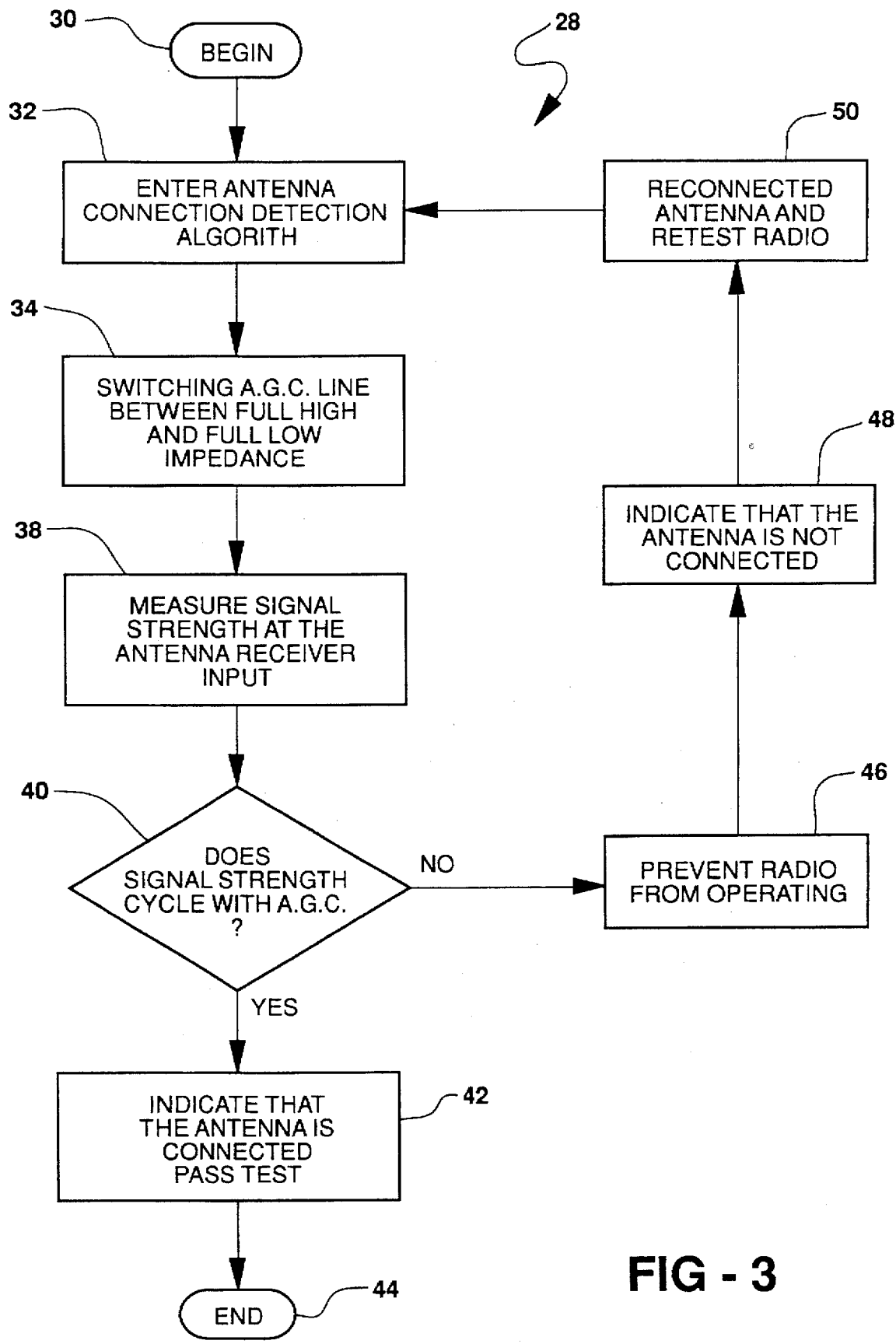
FIG. 3 is a flowchart of one embodiment of a method according to the present invention used in conjunction with the antenna system and receiver of FIG. 1.

Referring to FIG. 3, one embodiment of a method according to the present invention is generally indicated at 28. The method begins at 30. Power is received to power up the receiver 12. Upon an initiation procedure, pressing three buttons simultaneously in one embodiment, the receiver 12 enters into the antenna connection detection algorithm at 32. The automatic gain controller 18 is then switched or cycled between full high and full low impedance at 34. More specifically, the automatic gain controller 18 has a predetermined impedance in steady state. Upon execution of the initiation procedure, the variable impedance of the automatic gain controller 18 is increased by reducing the bias of the PIN diode 20. Once bias of the PIN diode 20 is eliminated, and a full high impedance results, the signal strength of the signal received from the antenna system 10 at an antenna receiver input port 36 (FIG. 1) is measured at 38. For testing at the manufacturing site, the signal is a reference RF signal of a known strength generated by a calibrated device. At repair sites differing from the manufacturing site, the signal may be generated by a similar calibrated device or, in the alternative, by use of a radio signal generated by a local radio station.

The automatic gain controller 18 is cycled at 36 which requires the bias of the PIN diode 20 to increase, allowing the variable impedance of the automatic gain controller 18 to return to full low impedance. The signal strength of the signal received from the antenna system 10 is again measured at 38 once the antenna gain controller 18 reached full low impedance.

The signal strength is then correlated to the impedance to generate a correlation. Based on the correlation, it can be determined whether the antenna system 10 is properly connected to the receiver 12. More specifically, if the signal strength cycles with or follows the automatic gain controller 18, a test performed at 40, it is indicated that the antenna system 10 is connected to the receiver 12 at 42. "Follows" is a term used to describe a signal that is not exactly like a reference signal, but mimics it in some term such as amplitude. The following signal is not exact because it may lag or include noise and the like. If the signal strength follows the impedance, the antenna connection test has been passed and the method is terminated at 44. If the signal strength does not cycle with or follow the automatic gain controller 18, the receiver 12 is prevented from operating in a normal fashion at 46. This is because the antenna system 10 is not connected to the receiver 12, leaving the resulting circuit open at the input port 36. As may be appreciated by those skilled in the art, changing the impedance of an open circuit will have little affect on the received signal strength. An indication that the antenna system 10 is not connected to the receiver 12 is set forth at 48 preventing the antenna connection detection algorithm to terminate. In one embodiment, the mere fact that the receiver 12 cannot exit the antenna connection detection algorithm is an indication that the antenna system 10 is not connected to the receiver 12. The antenna system 10 is reconnected and the receiver is instructed to retest at 50.

The method provides added function to existing portions of the receiver 12 to perform an important function and necessary function of determining whether the antenna system 10 is connected to the receiver 12.

The present invention has been described in an illustrative manner. It is to be understood that the terminology which has been used is intended to be in the nature of words of description rather than of limitation.

Many modifications and variations of the present invention are possible in light of the above teachings. Therefore, within the scope of the appended claims, the present invention may be practiced other than as specifically described.

What is claimed is:

1. A method for detecting an electrical connection between an antenna system and a receiver for a motor vehicle, the receiver having an automatic gain control with a variable impedance, the method comprising the steps of:

increasing the variable impedance of the automatic gain control;

measuring signal strength of a signal received from the antenna system;

decreasing the variable impedance of the automatic gain control;

measuring the signal strength of the signal received from the antenna system after the impedance of the automatic gain control has been decreased;

correlating the signal strength to the variable impedance to generate a correlation; and determining whether the antenna system is electrically connected the receiver based on the correlation of the signal strength to the variable impedance.

2. A method as set forth in claim 1 including the step of preventing the receiver from operating until the correlation is positive.

3. A method as set forth in claim 2 including the step of identify a correlation as positive when the signal strength follows the variable impedance of the automatic gain controller.

4. A method as set forth in claim 1 including the step of varying a bias across a PIN diode to perform the steps of increasing and decreasing the variable impedance.

5. A method for detecting an electrical connection between an antenna system and a receiver for a motor vehicle, the receiver having an automatic gain control with a PIN diode connected therebetween to create a variable impedance, the method comprising the steps of:

biasing the PIN diode to a predetermined biased level;

increasing the variable impedance of the automatic gain control;

measuring signal strength of a signal received from the antenna system;

increasing the predetermined bias level of the PIN diode;

decreasing the variable impedance of the automatic gain control;

measuring the signal strength of the signal received from the antenna system;

correlating the signal strength to the variable impedance to generate a correlation; and determining whether the antenna system is electrically connected to the receiver based on the correlation of the signal strength to the variable impedance.

6. A method as set forth in claim 5 including the step of preventing the receiver from operating until the correlation is positive.

7. A method as set forth in claim 6 including the step of identify a correlation as positive when the signal strength follows the variable impedance of the automatic gain controller.

8. A method for detecting an electrical connection between and antenna system and a receiver for a motor vehicle, the receiver having an automatic gain control with a PIN diode connected therebetween to create a variable impedance, the method comprising the steps of:

biasing the PIN diode to a predetermined bias level;

increasing the variable impedance of the automatic gain control;

measuring signal strength of a signal received from the antenna system;

increasing the predetermined bias level of the PIN diode;

decreasing the variable impedance of the automatic gain control;

measuring the signal strength of the signal received from the antenna; and determining whether the antenna system is electrically connected to the receiver when the signal strength follows the variable impedance of the automatic gain controller.

* * * * *